(12) United States Patent
Fujii

(10) Patent No.: US 6,703,147 B2
(45) Date of Patent: Mar. 9, 2004

(54) ORGANIC ELECTROLUMINESCENT DEVICE

(75) Inventor: Hiroyuki Fujii, Souraku-gun (JP)

(73) Assignee: Sanyo Electric Co., Ltd., Moriguchi (JP)

(*) Notice: Subject to any disclaimer, the term of this patent is extended or adjusted under 35 U.S.C. 154(b) by 53 days.

(21) Appl. No.: 09/943,877

(22) Filed: Aug. 31, 2001

(65) Prior Publication Data

US 2003/0127970 A1 Jul. 10, 2003

(30) Foreign Application Priority Data

Sep. 1, 2000 (JP) ........................................ 2000-265161

(51) Int. Cl.⁷ ............................................... H05B 33/14
(52) U.S. Cl. ...................... 428/690; 428/917; 313/504; 313/506
(58) Field of Search ................. 428/690, 917; 313/504, 506

(56) References Cited

U.S. PATENT DOCUMENTS

| | | | | |
|---|---|---|---|---|
| 5,061,569 A | * | 10/1991 | VanSlyke et al. | 428/457 |
| 5,126,214 A | * | 6/1992 | Tokailin et al. | 428/690 |
| 5,635,308 A | * | 6/1997 | Inoue et al. | 428/690 |
| 6,203,933 B1 | * | 3/2001 | Nakaya et al. | 428/690 |

FOREIGN PATENT DOCUMENTS

JP          8-311442 A   *   11/1996

OTHER PUBLICATIONS

Dong-ming Wang et al., "LiBq4 Used as Blue Organic Thin-film Electroluminescent Material", Journal of Shanghai University (Natural Science), vol. 6, No. 5, pp. 387–390, Oct. 2000.*

Hamada et al.; article entitled: "Organic light-emitting diodes using a gallium complex", Appl. Phys. Lett., Apr. 1998, vol. 72, No. 16, pp. 1939–1941.

* cited by examiner

Primary Examiner—Marie Yamnitzky
(74) Attorney, Agent, or Firm—W. F. Fasse; W. G. Fasse

(57) ABSTRACT

An organic electroluminescent device includes an organic luminescent substance interposed between a pair of mutually opposed electrodes, wherein the device contains at least a compound having the following general formula (VI) as the organic luminescent substance:

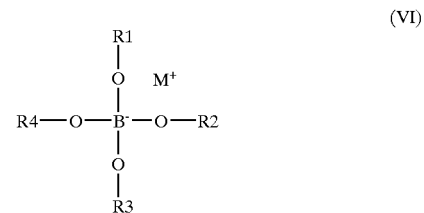

(VI)

(in the formula, the reference character M denotes a metal, and R1, R2, R3, and R4 separately denote substituents having the following general formula (VII) and may be similar or dissimilar to one another):

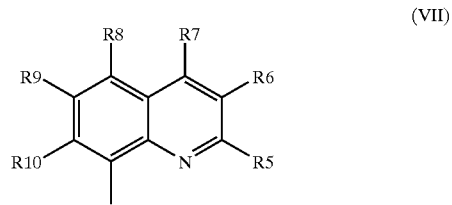

(VII)

(in the formula, the reference character R5 denotes hydrogen or an optional substituent group except methyl, and R6 to R10 separately denote hydrogen or optional substituent groups).

18 Claims, 1 Drawing Sheet

ORGANIC ELECTROLUMINESCENT DEVICE

BACKGROUND OF THE INVENTION

1. Field of the Invention

The present invention relates to an organic light emitting device such as an organic electroluminescent device and more particularly relates to an organic light emitting device using an innovative compound as an organic luminescent substance.

2. Related Art

As a thin type light emitting device, an organic electroluminescent (EL) device has extensively been investigated and a complex, aluminum tri(8-hydroxyquinoline) (Alq), having a structure in which 8-hydroxyquinoline (q) is coordination-bonded with aluminum has widely been used as an electron transporting material for an organic EL or as a main component in a doping (mixing) method. The luminescence peak wavelength in a luminescence spectrum of an Alq evaporation thin film exists near 530 nm and observed green-color luminescent light.

Further, a luminescent mixture containing a luminescent substance (a luminescent dopant) with the luminescence peak wavelength about 540 nm or longer and Alq has widely been employed to obtain luminescent color from green-color to red-color.

In the case of a full-color display being achieved by mixing primary colors, what is required is a light emitting device excellent in color purities respectively for blue-color, green-color and red-color. The color purity can be expressed in terms of chromaticity in the x-y chromaticity coordinates system of Commission International d'Eclairage (CIE). Ideal full-color display can be achieved if the obtained chromaticity for the blue-color is (x=0.14, y=0.08), for the green-color is (x=0.21, y=0.71) and for the red-color is (x=0.14, y=0.33).

A compound containing gallium and indium as a metal element belonging to group XIII as same as Al in a periodic table of elements is discussed in Appl. Phys. Lett., 1998, volume 72, Number 16, pages 1939–1941 and it is reported in the case of a gallium compound that the compound has EL peak wavelength of 502 nm and green-color emission has the chromaticity of (x=0.28, y=0.49) in the x-y chromaticity coordinates system of Commission International d'Eclairage (CIE) and in the case of an indium compound that the compound has EL peak wavelength of 545 nm and yellow green-color emission has the chromaticity of (x=0.35, y=0.56).

However, a satisfactory luminescent substance for emitting blue-color has not been found, because the color purity of such substances is either low or unstable.

SUMMARY OF THE INVENTION

An object of the present invention is to provide an organic electroluminescent device having luminescence in a wavelength range of shorter wavelength than that of green-color and more particularly, to provide an organic electroluminescent device capable of emitting blue-color with a high color purity as one of three primary colors and excellent in luminous efficiency.

The present invention according to a first aspect is an organic electroluminescent device comprising an organic luminescent substance interposed between a pair of mutually opposed electrodes, wherein the device contains at least a compound having the following general formula (I) as the organic luminescent substance:

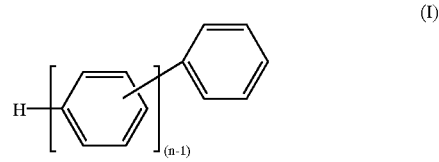

(I)

(in the formula, the reference character n is an integer of 3 or higher, and hydrogen bonded to any one or more of the aromatic rings may be substituted with an optional substituent).

The present invention according to a second aspect is the organic electroluminescent device as described in the first aspect, wherein the reference character n in the general formula (I) is an integer not lower than 5 and not higher than 12.

The present invention according to a third aspect is the organic electroluminescent device as described in the first or second aspects, wherein the weight per mole of the foregoing compound is 382 to 980 g/mol.

The present invention according to a fourth aspect is an organic electroluminescent device comprising an organic luminescent substance interposed between a pair of mutually opposed electrodes, wherein the device contains at least a compound having the following general formula (II) as the organic luminescent substance:

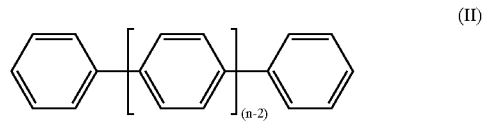

(II)

(in the formula, the reference character n is an integer of 3 or higher, and hydrogen bonded to any one or more of the aromatic rings may be substituted with an optional substituent).

The present invention according to a fifth aspect is the organic electroluminescent device as described in the fourth aspect, wherein the reference character n in the general formula (II) is an integer not lower than 5 and not higher than 9.

The present invention according to a sixth aspect is the organic electroluminescent device as described in the fourth or fifth aspects, wherein the weight per mole of the foregoing compound is 382 to 750 g/mol.

The present invention according to a seventh aspect is an organic electroluminescent device comprising first and second layers of first and second en organic luminescent substances interposed between a pair of mutually opposed electrodes, wherein the first layer contains at least a compound having the following general formula (I) as the first organic luminescent substance

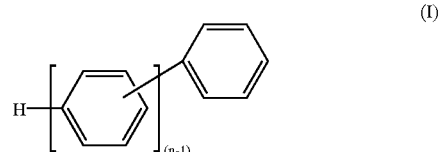

(I)

(in the formula, the reference character n is an integer of 3 or higher and hydrogen bonded to any one or more of the aromatic rings may be substituted with an optional substituent), and the second layer contains at least a compound having the following general formula (III) as the second organic luminescent substance:

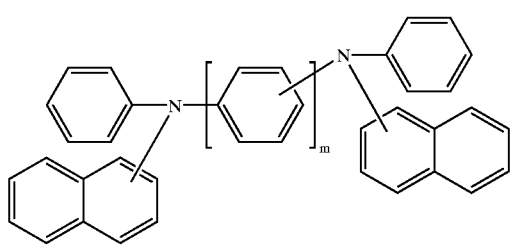

(III)

(in the formula, the reference character m is an integer of 1 or higher, and hydrogen bonded to any one or more of the aromatic rings may be substituted with an optional substituent).

The present invention according to an eighth aspect is the organic electroluminescent device as described in the seventh aspect, wherein the compound having the general formula (I) is contained in the first layer in a proportion of 20% or higher by mole ratio.

The present invention according to a ninth aspect is the organic eleetroluninescent device as described in the seventh aspect, wherein the compound having the general formula (I) is contained in the first layer in a proportion of 20% or higher by weight ratio.

The present invention according to a tenth aspect is the organic electroluminescent device as described in one of the seventh to ninth aspects, wherein the first layer is formed adjacently to either one of the pair of the opposed electrodes.

The present invention according to an eleventh aspect is an organic electroluminescent device comprising an organic luminescent substance interposed between a pair of mutually opposed electrodes, wherein the device contains at least a compound having the following general formula (IV) as the organic luminescent substance:

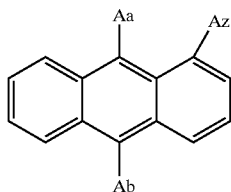

(IV)

(in the formula, the reference characters Aa, Ab, and Az separately denote substituents with aromatic properties and may be similar or dissimilar to one another).

The present invention according to a twelfth aspect is an organic electroluminescent device comprising an organic luminescent substance interposed between a pair of mutually opposed electrodes, wherein the device contains at least a compound having the following general formula (V) as the organic luminescent substance:

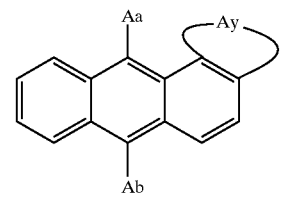

(V)

(in the formula, the reference characters Aa and Ab separately denote substituents with aromatic properties and may be similar or dissimilar to each other, and Ay denotes a substituent group having an aromatic cyclic structure).

Practical examples of the reference characters Aa, Ab, and Az in the foregoing general formula (IV) and the reference characters Aa and Ab in the foregoing general formula (V) are phenyl, naphthyl, anthryl, benzoyl, a diphenylamino group, a phenylnaphthylamino group, a dinaphthylamino group, pyridyl, oxazolyl, oxadiazolyl, phenylethynyl, arylethynyl, styryl, and the like.

In the present invention, the term "substituents with aromatic properties" not only means the aromatic substituent groups but also includes substituent groups with aromatic cyclic structures bonded through double bonds or triple bonds. The substituent groups with aromatic cyclic structures bonded through double bonds or triple bonds are, for example, the above described phenylethynyl, arylethynyl, styryl and the like.

The present invention according to a thirteenth aspect is an organic electroluminescent device comprising an organic luminescent substance interposed between a pair of mutually opposed electrodes, wherein the device contains at least a compound having the following general formula (VI) as the organic luminescent substance:

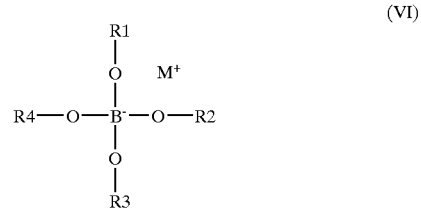

(VI)

(in the formula, the reference character H denotes a metal, and R1, R2, R3, and R4 separately denote substituents having the following general formula (VII) and may be similar or dissimilar to one another)

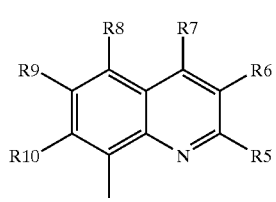

(VII)

(in the formula, the reference character R5 denotes hydrogen or an optional substituent group except methyl, and R6 to R10 separately denote hydrogen or optional substituent groups).

The present invention according to a sixteenth aspect is an organic electroluminescent device comprising first and second organic luminescent substances interposed between a pair of mutually opposed electrodes, wherein the device contains at least a compound having the following general formula (VI) as the first organic luminescent substance:

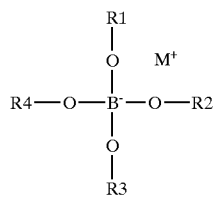
(VI)

(in the formula, the reference character M denotes a metal, and R1, R2, R3, and R4 separately denote substituents having the following general formula (VII) and may be similar or dissimilar to one another)

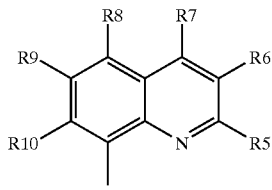
(VII)

(in the formula, the reference characters R5 to R10 separately denote hydrogen or optional substituent groups); and a compound having the following general formula (I) as the second organic luminescent substance:

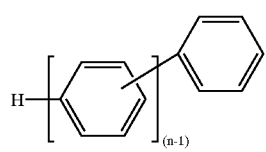
(I)

(in the formula, the reference character n is an integer of 3 or higher, and hydrogen bonded to any one of the aromatic rings may be substituted with an optional substituent.

The present invention according to a nineteenth aspect is an organic electroluminescent device comprising an organic luminescent substance interposed between a pair of mutually opposed electrodes, wherein the device contains at least a compound having the following general formula (VI):

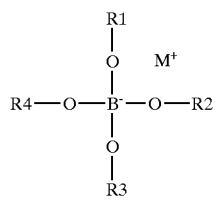
(VI)

(in the formula, the reference character 14 denotes a metal, and R1, R2, R3, and R4 separately denote substituents having the following general formula (VII) and may be similar or dissimilar to one another)

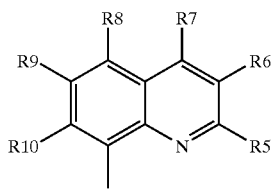
(VII)

(in the formula, the reference characters R5 to R10 separately denote hydrogen or optional substituent groups), and a compound having the following general formula (IV), as the organic luminescent substance:

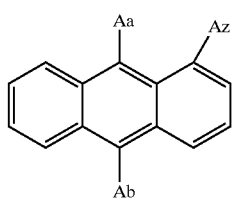
(IV)

(in the formula, the reference characters Aa, Ab, and Az separately denote substituents with aromatic properties and may be similar or dissimilar to one another).

The present invention according to a twenty-second aspect is an organic electroluminescent device comprising an organic luminescent substance interposed between a pair of mutually opposed electrodes, wherein the device contains at least a compound having the following general formula (VI) as the organic luminescent substance:

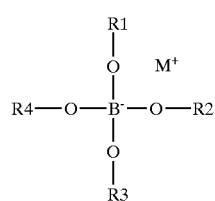
(VI)

(in the formula, the reference character M denotes a metal, and R1, R2, R3, and R4 separately denote substituents having the following general formula (VII) and may be similar or dissimilar to one another)

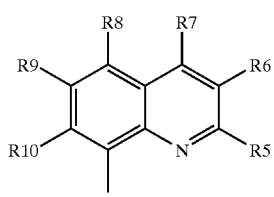
(VII)

(in the formula, the reference characters R5 to R10 separately denote hydrogen or optional substituent groups); and an aromatic amine.

The present invention according to a twenty-third aspect is the organic electroluminescent device as described in the twenty-second aspect, wherein the aromatic amine is a compound having the following general formula (III):

(III)

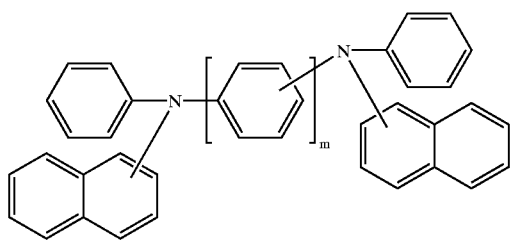

(in the formula, the reference character m is an integer of 1 or higher, and hydrogen bonded to any one or more of the aromatic rings may be substituted with an optional substituent).

The present invention according to a twenty-fifth aspect is the organic electroluminescent device as described in the twenty-second aspect, wherein the aromatic amine is a compound having the following general formula (VIII):

(VIII)

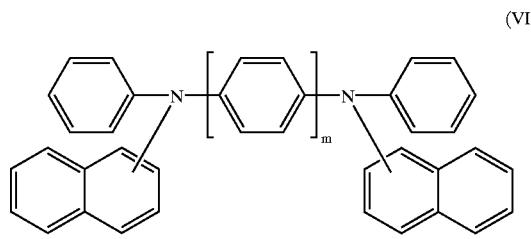

(in the formula, the reference character m is an integer of 1 or higher).

The present invention according to a twenty-seventh aspect is the organic electroluminescent device as described in the twenty-second aspect, wherein the aromatic amine is a compound having the following general formula (IX):

(IX)

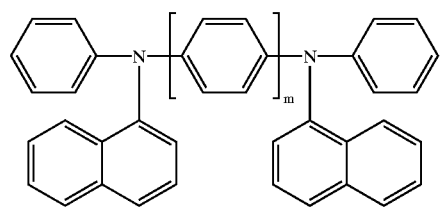

(in the formula, the reference character m is an integer of 1 or higher).

The present invention according to twenty-fourth, twenty-sixth and twenty-eighth aspects is the organic electroluminescent device, wherein the reference character m is an integer not lower than 1 and not higher than 12 in the general formulas (III), (VIII) or (IX).

The present invention according to fourteenth, Seventeenth, twentieth and twenty-ninth aspects is the organic electroluminescent device, wherein the metal element M in the general formula (VI) is sodium, potassium, rubidium, or cesium.

The present invention according to fifteenth, eighteenth, twenty-first and thirtieth aspects is the organic electroluminescent device, wherein the metal element M in the general formula (VI) is potassium.

In a luminescent substance in the present invention, the energy difference between two electron orbits; the highest occupied molecular orbit (HOMO) and the lowest unoccupied molecular orbit (LUMO); is wide and the substance therefore becomes suitable for emitting light in a wavelength range of shorter wavelength than that of green-color. Further, as compared with a conventional material, owing to the improved transportation property of electrons and/or holes and the increase of the quantum yield of luminescence, the luminous efficiency is improved.

DESCRIPTION OF PREFERRED EXAMPLES

Figure 1:
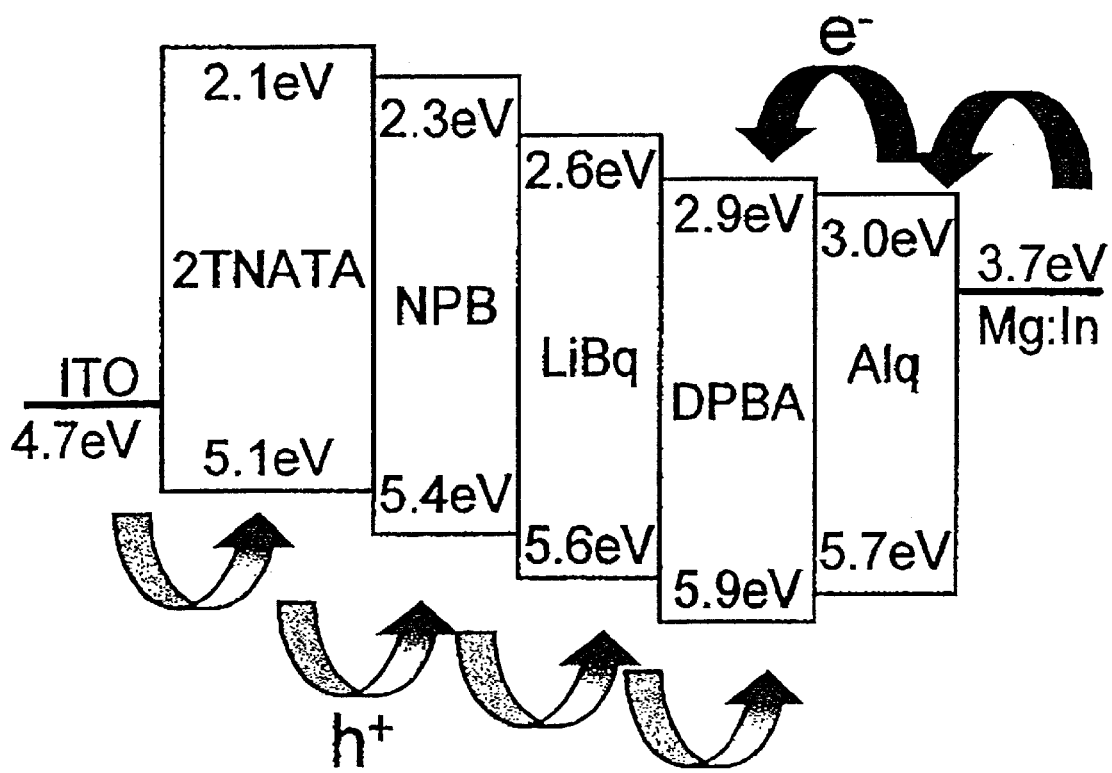
FIG. 1 shows the energy levels of the lowest unoccupied molecular orbits (LUMO) and the highest occupied molecular orbits (HOMO) of the respective organic layers in examples according to the present invention.

[Synthesis 1 of Luminescent Substance Containing Boron]

According to the synthesis scheme shown in (chem. 1), a luminescent substance illustrated as (chem. 2), that is, lithium tetra-(8-hydroxyquinolinato) boron (LiBq) was synthesized. At a room temperature, using 2-propanol as a solvent, lithium borohydride (LiBH$_4$) in the substance amount z=0.04 mol (z is preferably 0.01 mol or higher and 100 mol or lower) and 8-hydroxyquinoline in the substance amount y=4.2z (y is preferably to be 4z to 5z) were mixed and reacted with each other to obtain a solid and the solid taken out by filtration was heated and sublimated in the pressure of $10^{-3}$ Pa or lower to obtain the sublimated substance, which was used as the luminescent substance.

(Chem. 1)

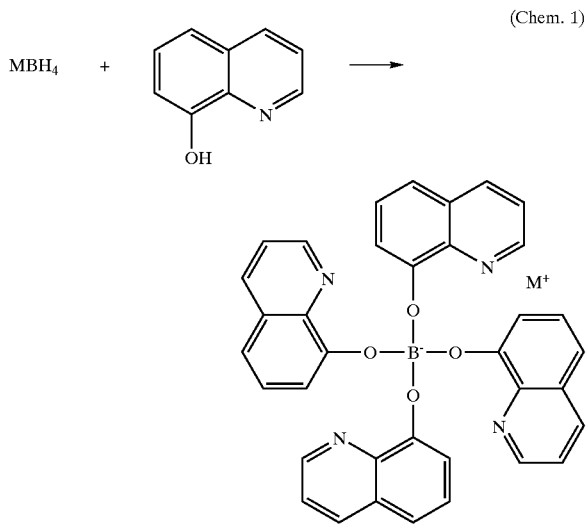

-continued

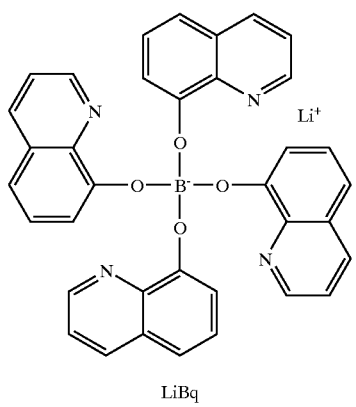

LiBq

The powder of LiBq had about 456 nm peak wavelength of photo-excited luminescence (PL) and the PL peak wavelength of an evaporated thin film was about 498 nm. Since these wavelength values were in shorter side than 530 nm, which is the PL peak wavelength of Alq, by about 74 nm and about 32 nm, respectively, the substance could be supposed to be suitable as a luminescent substance for blue color type light emission. Further, the PL peak wavelength of LiBq in an acetone solution was about 381 nm and the peak wavelength difference between the solution and the evaporation thin film was as extremely high as about 0.76 eV in conversion into energy (in the case of Alq, about 0.02 eV). That was supposedly attributed to that LiBq had considerably strong intermolecular effect in the evaporated thin film.

[Synthesis 2 of Luminescent Substance Containing Boron]

Sodium tetra-(8-hydroxyquinolinato) boron (NaBq) was synthesized, in the same manner as described above except that sodium borohydride ($NaBH_4$) was used in place of $LiBH_4$ as the $MBH_4$ in (chem. 1).

[Synthesis 3 of Luminescent Substance Containing Boron]

Potassium tetra-(8-hydroxyquinolinato) boron (KBq) was synthesized, in the same manner as described above except that potassium borohydride ($KBH_4$) was used in place of $LiBH_4$ as the $MBH_4$ in (Chem. 1).

EXAMPLE 1

On a glass substrate previously bearing an anode of $In_2O_3$—$SnO_2$ (ITO) powder, an organic thin film was formed by evaporation in the vacuum degree of $10^{-6}$ Torr level, that was $10^{-4}$ Pa level and then an indium-containing magnesium cathode (Mg:In) to fabricate an electroluminescent device. More particularly, fabrication was carried out as follows.

Formed as a hole injecting and transporting layer on the anode surface were a 2TNATA layer illustrated as (Chem. 3) and then a 4,4'-bis[N-(1-naphthyl)-N-phenyl-amino] biphenyl (NPB) layer illustrated as (chem. 4) and formed in the cathode side as a luminescent substance layer was a LiBq layer and further a magnesium cathode containing 10% by weight of indium was evaporated to fabricate a three-layer type organic electroluminescent device. The film thickness of each layer measured by a quartz oscillation type film thickness meter was as follows: ITO/2TNATA (25 nm)/NPB (10 nm)/LiBq (25 nm)/Mg:In (200 nm).

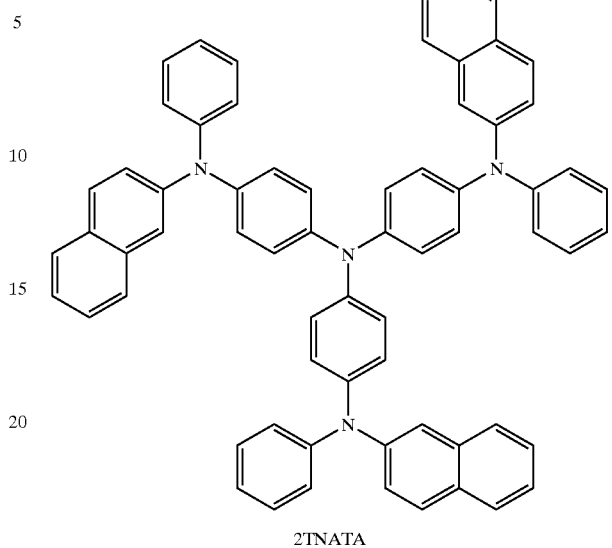

2TNATA

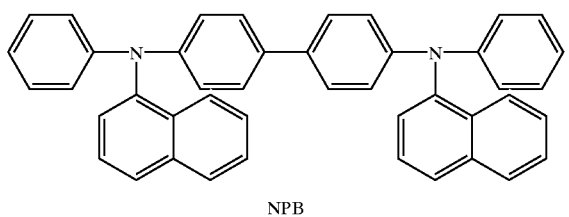

NPB

The simplified molecular formula of 2TNATA was $C_{66}H_{48}N_4$, the weight per mole was 905.1 g/mol, the melting point was 255° C., the glass transition temperature was 110° C., ionization potential was 5.0 eV to 5.1 eV, and the energy gap between the highest occupied molecular orbit (HOMO) and the lowest unoccupied molecular orbit (LUMO) was 3.0 eV.

The simplified molecular formula of NPB was $C_{44}H_{32}N_2$, the weight per mole was 588.75 g/mol, the melting point was 277° C., the glass transition temperature was 95° C., ionization potential was 5.4 eV, and the energy gap between HOMO and LUMO was 3.1 eV.

The simplified molecular formula of LiBq was $C_{36}H_{24}N_4O_4BLi$, the weight per mole was 594.35 g/mol, ionization potential was 5.6 eV, and the energy gap was 3.0 eV.

On the measurement of the light emitting properties of the device, blue green-emitting electroluminescence of 320 cd/m² luminance was obtained at the time of 18V application and the current luminous efficiency was 1.4 cd/A. Further, at the time of 20 V application, luminance was 910 cd/m², the current luminous efficiency was 1.5 cd/A, and the chromaticity was (x=0.25, y=0.54) in the x-y chromaticity coordinates system of CIE. Further, at the time of 23 V application, luminance was 3,300 cd/m² and the current luminous efficiency was 1.1 cd/A. The chromaticity of the foregoing device was luminescent color nearer to blue-color than the green-emitting luminescent color of (x=0.28, y=0.49) of an electroluminescent device using a gallium compound and disclosed in Appl. Phys. Lett., 1998, Volume 72, Number 16, pages 1939–1941.

On the other hand, crystallization tendency was slightly found following the temperature increase of the device.

Incidentally, although NPB was used in the above described example, those substances having general formulas (III), (VIII), or (IX) may be used instead. In that case, if m is 13 or higher, the sublimation property and the solubility tend to be deficient to make thin film formation difficult, so that it is supposed that m is preferably 12 or lower and further preferably 6 or lower.

EXAMPLE 2

In the same manner as that in the example 1, a 2TNATA layer was formed on the ITO surface of an anode and then an NPB layer and successively a LiBq layer were formed and after that further an Alq layer illustrated as (Chem. 5) was evaporated and a cathode was formed to fabricate a four-layer type organic electroluminescent device. The film thickness of each layer measured by a quartz oscillation type film thickness meter was as follows: ITO/2TNATA (26 nm)/NPB (11 nm)/LiBq (16 nm)/Alq (7 nm)/Mg:In (200 nm).

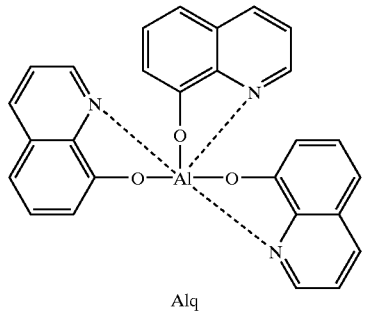

(Chem. 5)

Alq

On the measurement of the light emitting properties of the device, blue green-emitting electroluminescence of 60 cd/m$^2$ luminance was obtained at the time of 17V application and the current luminous efficiency was 0.4 cd/A and the chromaticity was (x=0.19, y=0.52) in the x-y chromaticity coordinates system of CIE and the luminescence peak wavelength was 490 nm. Further, at the time of 21 V application, blue green-emitting luminescence 2 with luminance of 178 cd/m was obtained. Consequently, as compared with that in the example 1, the luminous efficiency was decreased, however luminescence color further closer to blue color was obtained. Further, as compared with the case in the example 1, crystallization was suppressed and the stability improvement tendency was observed. That was supposedly attributed to that since organic layers with different molecular structure and lattice constants were formed in the upper and lower on the relatively thin LiBq layer, the crystallization of the LiBq layer was consequently suppressed.

EXAMPLE 3

In the same manner as that in the example 2, a 2TNATA layer was formed on the ITO surface of an anode and then an NPB layer and successively a NaBq layer were formed and after that further, an Alq layer was evaporated and a cathode was formed to fabricate a four-layer type organic electroluminescent device. The film thickness of each layer measured by a quartz oscillation type film thickness meter was as follows: ITO/2TNATA (27 nm)/NPB (12 nm)/NaBq (17 nm)/Alq (7 nm)/Mg:In (200 nm).

On the measurement of the light emitting properties of the device, blue green-emitting electroluminescence of 50 cd/m$^2$ luminance was obtained at the time of 17V application and the current luminous efficiency was 0.3 cd/A and the chromaticity was (x=0.20, y=0.51) in the x-y chromaticity coordinates system of CIE. Consequently, as compared with that in the example 2, the luminous efficiency was decreased. Further, as compared with that in the example 1, the luminous efficiency was decreased, however luminescence color closer to blue-color was obtained.

EXAMPLE 4

In the same manner as that in the example 2, a 2TNATA layer was formed on the ITO surface of an anode and then an NPB layer and successively a KBq layer were formed and after that further, an Alq layer was evaporated and a cathode was formed to fabricate a four-layer type organic electroluminescent device. The film thickness of each layer measured by a quartz oscillation type film thickness meter was as follows: ITO/2TNATA (25 nm)/NPB (10 nm)/KBq (16 nm)/Alq (7 nm)/Mg:In (200 nm).

On the measurement of the light emitting properties of the device, blue green-emitting electroluminescence of 80 cd/m$^2$ luminance was obtained at the time of 17V application and the current luminous efficiency was 0.5 cd/A and the chromaticity was (x=0.18, y=0.51) in the x-y chromaticity coordinates system of CIE. Consequently, as compared with that in the examples 2, 3, the luminous efficiency was increased and luminescence color closer to blue-color was obtained.

EXAMPLE 5

In order to suppress crystallization of LiBq, an electroluminescent device was fabricated while using a mixture of LiBq and another substance as luminescent substances.

In the same manner as the example 1, a 2TNATA layer on the anode surface and then an NPB layer were formed and successively p-quinquephenyl (P5) illustrated as (Chem. 6) and LiBq mixed in 1:1 mole ratio were evaporated and after that further, an Alq layer was evaporated and a cathode was formed to fabricate a four-layer type organic electroluminescent device. The film thickness of each layer measured by a quartz oscillation type film thickness meter was as follows: ITO/2TNATA (26 nm)/NPB (10 nm)/LBq+P5 (24 nm)/Alq (7 nm)/Mg:In (200 nm).

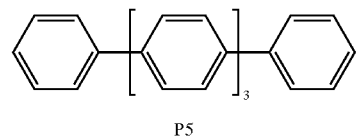

(Chem. 6)

P5

The simplified molecular formula of P5 was $C_{30}H_{22}$ and the weight per mole was 382.50 g/mol.

Since the weight per mole of LiBq is 594.35 g/mol, the content of P5 in the mixture of the foregoing P5 and LiBq was 39.2% by weight.

On the measurement of the light emitting properties of the device, blue-emitting electroluminescence of 136 cd/m² luminance was obtained at the time of 24 V application and the current luminous efficiency was 0.4 cd/A and the chromaticity was (x=0.22, y=0.49) in the x-y chromaticity coordinates system of CIE. Further, at the time of 26 V application, blue-emitting electroluminescence of 311 cd/m² luminance was obtained and the current luminous efficiency was 0.3 cd/A. Consequently, as compared with that in the example 1, the luminous efficiency was decreased, however luminescence color was further closer to blue-color. Further, as compared with the case in the example 1, the crystallization was suppressed and the stability improvement tendency was observed. That was supposedly attributed to that the crystallization of the mixture was suppressed by mixing P5, which is an aromatic hydrocarbon with low polarity and having a rod-like stereo-molecular structure, and LiBq with a high polarity and having a right tetrahedral stereo-molecular structure.

Incidentally, the content of P5 in the mixture of P5 and LiBq was 39.2% by weight, that was 50.0% by mole, in the above described example, for the purpose of suppressing the crystallization, it is supposed to be preferable to be 20% by weight. Also, by mole ratio, it is supposed to be preferable to be 20% by mole.

Further, although P5 was employed in the above described example, substances having general formula (I) or (II) could be employed in place of P5.

EXAMPLE 6

In the same manner as the example 1, a 2TNATA layer on the anode surface and then an NPB layer were formed and successively p-sexiphenyl (P6) illustrated as (Chem. 7) was evaporated and after that further, a cathode was formed to fabricate a three-layer type organic electroluminescent device. The film thickness of each layer measured by a quartz oscillation type film thickness meter was as follows: ITO/2TNATA (26 nm)/NPB (11 nm)/P6 (30 nm)/Mg:In (250 nm).

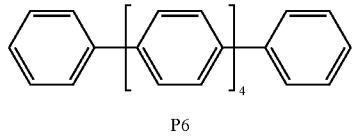

(Chem. 7)

P6

The simplified molecular formula of P6 was $C_{36}H_{26}$ and the weight per mole was 458.59 g/mol.

On the measurement of the light emitting properties of the device, blue-emitting electroluminescence of 1500 cd/m² luminance was obtained at the time of 11 V application, the current luminous efficiency was 1.0 cd/A, the chromaticity was (x=0.12, y=0.055) in the x-y chromaticity coordinates system of CIE, and luminescence peak wavelength was 447 nm. Further, at the time of 13 V application, blue-emitting electroluminescence of 1830 cd/m² luminance was obtained and the current luminous efficiency was 0.8 cd/A. Consequently, as compared with that in the example 1, the luminous efficiency was decreased, however luminescence color obtained was remarkably closer to blue-color.

Incidentally, although P6 was employed in the above described example, substances having general formula (I) or (II) could be employed in place of P6.

EXAMPLE 7

In the same manner as the example 1, a 2TNATA layer on the anode surface and then an NPB layer were formed and successively rubrene illustrated as (Chem. 8) and LiBq mixed in 5:95 by weight ratio were evaporated and further an Alq layer was formed and after that, a cathode was formed to fabricate a four-layer type organic electroluminescent device. The film thickness of each layer measured by a quartz oscillation type film thickness meter was as follows: ITO/2TNATA (24 nm)/NPB (11 nm)/LiBq+rubrene (5.9 nm)/Alq (11 nm)/Mg:In (200 nm).

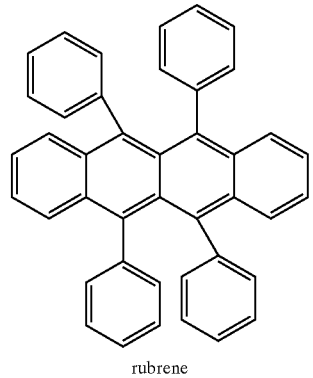

(Chem. 8)

rubrene

The simplified molecular formula of rubrene was $C_{42}H_{28}$, the weight per mole was 532.69 g/mol, the melting point was 315° C., ionization potential was 5.4 eV, and the energy gap between HOMO and LUMO was 2.2 eV.

On the measurement of the light emitting properties of the 2 device, yellow green-emitting electroluminescence of 186 cd/m² luminance was obtained at the time of 14 V application, the current luminous efficiency was 0.22 cd/A, and the chromaticity was (x=0.35, y=0.56) in the x-y chromaticity coordinates system of CIE. Consequently, as compared with that in the example 1, the luminous efficiency was decreased and luminescence color obtained was closer to yellow-color. Further, at the time of 18 V application, yellow green-emitting electroluminescence of 810 cd/m² luminance was obtained.

EXAMPLE 8

In the same manner as the example 5, a 2TNATA layer on the anode surface and then an NPB layer were formed and successively 9,10-diphenylanthracene (DPA) illustrated as (Chem. 9) and LiBq mixed in 1:1 by mole ratio were evaporated and further an Alq layer was formed and after that, a cathode was formed to fabricate a four-layer type organic electroluminescent device. The film thickness of each layer measured by a quartz oscillation type film thickness meter was as follows: ITO/2TNATA (26 nm)/NPB (10 nm)/LiBq+DPA (19 nm)/Alq (25 nm)/Mg:In (200 nm).

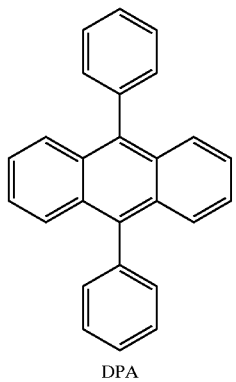

(Chem. 9)

DPA

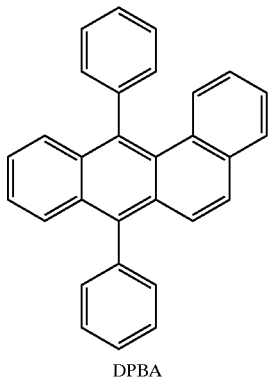

(Chem. 10)

DPBA

The simplified molecular formula of DPA was $C_{26}H_{18}$, the weight per mole was 330.42 g/mol, the melting point was 245° C. to 248° C., ionization potential was 5.8 eV, and the energy gap was 3.0 eV.

On the measurement of the light emitting properties of the device, green-emitting electroluminescence of 5.7 cd/m² luminance was obtained at the time of 30 V application, the current luminous efficiency was 0.11 cd/A and the chromaticity was (x=0.30, y=0.56) in the x-y chromaticity coordinates system of CIE. Further, at the time of 32 V application, green-emitting electroluminescence of 9.1 cd/m² luminance was obtained and the current luminous efficiency was 0.11 cd/A. Further, at the time of 36 V application, green-emitting electroluminescence of 21.8 cd/m² luminance was obtained and the current luminous efficiency was 0.10 cd/A. Consequently, as compared with that in the example 1, the luminous efficiency was decreased and luminescence color obtained was closer to green-color.

Incidentally, although DPA was employed in the above described example, substances having general formula (IV) or (V) could be employed in place of DPA.

EXAMPLE 9

In the same manner as the example 8, a 2TNATA layer on the anode surface and then an NPB layer were formed and successively 9,10-diphenyl-1,2-benzanthracene (DPBA) illustrated as (Chem. 10) and LiBq mixed in 1:1 by mole ratio were evaporated and further an Alq layer was formed and after that, a cathode was formed to fabricate a four-layer type organic electroluminescent device. The film thickness of each layer measured by a quartz oscillation type film thickness meter was as follows: ITO/2TNATA (26 nm)/NPB (11 nm)/LiBq+DPBA (18 nm)/Alq (7 nm)/Mg:In (200 nm).

The simplified molecular formula of DPBA was $C_{30}H_2O$ and the weight per mole was 380.48 g/mol. Further, ionization potential was 5.9 eV and the energy gap was 3.0 eV.

The ionization potential corresponding to the energy level of highest occupied molecular orbit (HOMO) and the lowest unoccupied molecular orbit (LUMO) can be calculated by subtracting the energy gap value from the ionization potential value. The LUMO and HOMO energy levels of the respective organic layers of the above described example are shown in FIG. 1.

In FIG. 1, the numeral values in the upper side indicate the energy levels of LUMO and the numeral values in the lower side indicate the energy levels of HOMO. Further, for ITO and Mg:In electrodes, Fermi levels are illustrated. In this example, since the energy level difference of HOMO of neighboring organic layers was 0.3 eV or lower, the holes (h+) injected from ITO were easily transported to the layer containing DPBA. Further, since the energy level difference of LUMO of neighboring organic layers was also 0.3 eV or lower and especially it was only 0.1 eV between the Alq layer and the layer containing DPBA, the electrons (e−) injected from the Mg: In electrode were easily transported to the layer containing DPBA. Consequently, it can be supposed that the electrons and the holes are efficiently re-coupled in the DPBA molecule and luminescence from the DPBA molecule can efficiently be performed.

On the measurement of the light emitting properties of the device, blue-emitting electroluminescence of 159 cd/m luminance was obtained at the time of 17 V application, the current luminous efficiency was 0.10 cd/A and the chromaticity was (x=0.14, y=0.35) in the x-y chromaticity coordinates system of CIE. Further, at the time of 19 V application, blue-emitting 2 electroluminescence of 732 cd/m² luminance was obtained and the current luminous efficiency was 0.10 cd/A. Further, the luminescence peak wavelength was 520 nm. Consequently, as compared with that in the example 8, the luminous efficiency was the same and luminescence color obtained was closer to blue-color.

Incidentally, although DPBA was employed in the above described example, substances having general formula (IV) or (V) could be employed in place of DPBA.

EXAMPLE 10

In the same manner as the example 9, a 2TNATA layer on the anode surface and then an NPB layer were formed and successively 9, 10-diphenyl-1,2-benzanthracene (DPBA) illustrated as (Chem. 10) was solely evaporated and further an Alq layer was formed and after that, a cathode was formed to fabricate a four-layer type organic electroluminescent device. The film thickness of each layer measured by a quartz oscillation type film thickness meter was as follows: ITO/2TNATA (26 nm)/NPB (11 nm)/DPBA (20 nm)/Alq (7 nm)/Mg:In (200 nm).

On the measurement of the light emitting properties of the device, blue-emitting electroluminescence of 154 cd/m² luminance was obtained at the time of 16 V application, the current luminous efficiency was 0.55 cd/A and the chromaticity was (x=0.12, y=0.29) in the x-y chromaticity coordinates system of CIE. Further, at the time of 18 V application, blue-emitting electroluminescence of 814 cd/m² luminance was obtained and the current luminous efficiency was 0.64 cd/A. Further, at the time of 19 V application, blue-emitting electroluminescence of 5550 cd/m² luminance was obtained and the current luminous efficiency was 0.89 cd/A. The luminescence peak wavelength was 492 nm. Consequently, as compared with that in the example 9, the luminous efficiency was considerably improved and luminescence color obtained was closer to blue-color.

Incidentally, although DPBA was employed in the above described example, substances having general formula (IV) or (V) could be employed in place of DPBA.

EXAMPLE 11

In the same manner as the example 5, a 2TNATA layer was formed on the anode surface and then, NPB and LiBq mixed in 101:11 by weight ratio were evaporated and further an Alq layer was formed and after that, a cathode was formed to fabricate a three-layer type organic electroluminescent device. The film thickness of each layer measured by a quartz oscillation type film thickness meter was as follows: ITO/2TNATA (52 nm)/NPB+LiBq (40 nm)/Alq (7 nm)/Mg:In (250 nm).

On the measurement of the light emitting properties of the device, blue green-emitting electroluminescence of 11 cd/m² luminance was obtained at the time of 34 V application, the current luminous efficiency was 0.4 cd/A and the chromaticity was (x=0.29, y=0.56) in the x-y chromaticity coordinates system of CIE. Further, at the time of 41 V application, blue green-emitting electroluminescence of 294 cd/m² luminance was obtained and the current luminous efficiency was 0.4 cd/A. Further, in the emission spectrum, the maximum luminescence peak was observed at 537 nm and the second maximum luminescence peak was observed at 495 nm. Consequently, as compared with that in the example 1, the luminous efficiency was decreased and the luminescence color obtained was closer to green-color.

Comparative Example 1

In the same manner as the example 11, a 2TNATA layer was formed on the anode surface and then, NPB was solely evaporated and further an Alq layer was formed and after that, a cathode was formed to fabricate a three-layer type organic electroluminescent device. The film thickness of each layer measured by a quartz oscillation type film thickness meter was as follows: ITO/2TNATA (52 nm)/NPB (12 nm)/Alq (7 nm)/Mg:In (250 nm).

On the measurement of the light emitting properties of the device, blue green-emitting electroluminescence of 12 cd/m² luminance was obtained at the time of 19 V application, the current luminous efficiency was 0.14 cd/A and the chromaticity was (x=0.24, y=0.58) in the x-y chromaticity coordinates system of CIE. Further, at the time of 24 V application, green-emitting 2 electroluminescence of 104 cd/m luminance was obtained and the current luminous efficiency was 0.15 cd/A. Further, at the time of 26 V application, green-emitting electroluminescence of 342 cd/m² luminance was obtained and the current luminous efficiency was 0.09 cd/A. In the emission spectrum, the luminescence peaks were observed at 532 nm and at 495 nm. Consequently, as compared with that in the example 11, the luminous efficiency was decreased and the luminescence color obtained was closer to green-color.

According to the present invention, it is made possible to obtain an organic electroluminescent device capable of emitting luminescence in a wavelength range of shorter wavelength than that of green color and having a high luminous efficiency and such an organic electroluminescent device can be applied to a variety of fields for such as a full color display apparatus.

What is claimed is:

1. An organic electroluminescent device comprising an organic luminescent substance interposed between a pair of mutually opposed electrodes, wherein the device contains at least a compound having the following general formula (VI) as said organic luminescent substance:

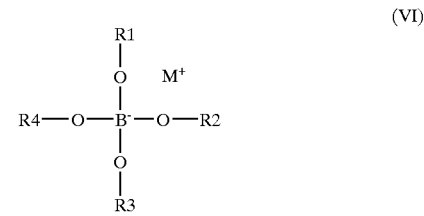

(in the formula, the reference character M denotes a metal, and R1, R2, R3, and R4 separately denote substituents having the following general formula (VII) and may be similar or dissimilar to one another):

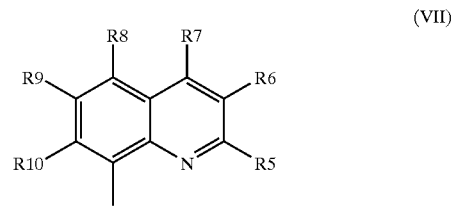

(in the formula, the reference character R5 denotes hydrogen or an optional substituent group except methyl, and R6 to R10 separately denote hydrogen or optional substituent groups).

2. The organic electroluminescent device as claimed in claim 1, wherein the metal element M in the general formula (VI) is sodium, potassium, rubidium, or cesium.

3. The organic electroluminescent device as claimed in claim 1, wherein the metal M in the general formula (VI) is potassium.

4. An organic electroluminescent device comprising first and second organic luminescent substances interposed between a pair of mutually opposed electrodes, wherein the device contains a compound having the following general formula (VI) as said first organic luminescent substance:

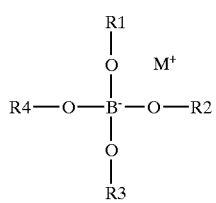

(VI)

(in the formula, the reference character M denotes a metal, and R1, R2, R3, and R4 separately denote substituents having the following general formula (VII) and may be similar or dissimilar to one another):

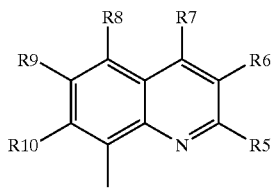

(VII)

(in the formula, the reference characters R5 to R10 separately denote hydrogen or optional substituent groups); and the device further contains a compound having the following general formula (I) as said second organic luminescent substance:

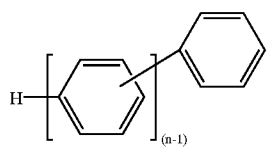

(I)

(in the formula, the reference character n is an integer of 3 or higher, and hydrogen bonded to any one of the aromatic ring rings may be substituted with an optional substituent).

5. The organic electroluminescent device as claimed in claim 4, wherein the metal element M in the general formula (VI) is sodium, potassium, rubidium, or cesium.

6. The organic electroluminescent device as claimed in claim 4, wherein the metal M in the general formula (VI) is potassium.

7. An Organic electroluminescent device comprising an organic luminescent substance interposed between a pair of mutually opposed electrodes, wherein the organic luminescent substance contains at least a compound having the following general formula (VI):

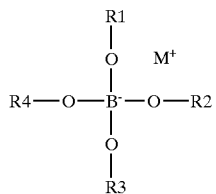

(VI)

(in the formula, the reference character M denotes a metal, and R1, R2, R3, and R4 separately denote substituents having the following general formula (VII) and may be similar or dissimilar to one another):

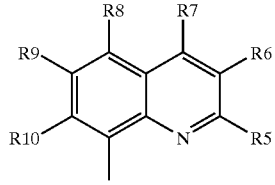

(VII)

(in the formula, the reference characters R5 to R10 separately denote hydrogen or optional substituent groups, and a compound having the following general formula (IV):

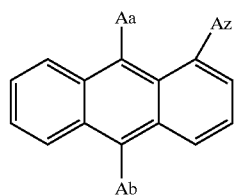

(IV)

(in the formula, the reference characterB Aa, Ab, and Az separately denote substituents with aromatic properties and may be similar or dissimilar to one another).

8. The organic electroluminescent device as claimed in claim 7, wherein the metal M in the general formula (VI) is sodium, potassium, rubidium, or cesium.

9. The organic electroluminescent device as claimed in claim 7, wherein the metal M in the general formula (VI) is potassium.

10. An organic electroluminescent device comprising organic luminescent substances interposed between a pair of mutually opposed electrodes, wherein the organic luminescent substances comprise an aromatic amine and at least a compound having the following general formula (VI):

(VI)

(in the formula, the reference character M denotes a metal, and R1, R2, R3, and R4 separately denote substituents having the following general formula (VII) and may be similar or dissimilar to one another):

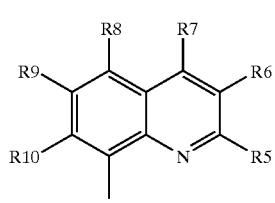

(VII)

(in the formula, the reference characters R5 to R10 separately denote hydrogen or optional substituent groups).

11. The organic electroluminescent device as claimed in claim 10, wherein said aromatic amine is a compound having the following general formula (III):

(III)

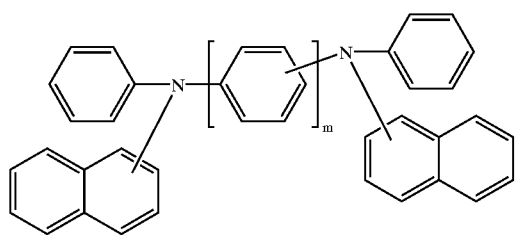

(in the formula, the reference character m is an integer of 1 or higher, and hydrogen bonded to any one or more of the aromatic rings may be substituted with an optional substituent).

12. The organic electroluminescent device as claimed in claim 11, wherein the reference character m is an integer not lower than 1 and not higher than 12 in the general formula (III).

13. The organic electroluminescent device as claimed in claim 10, wherein said aromatic amine is a compound having the following general formula (VIII):

(VIII)

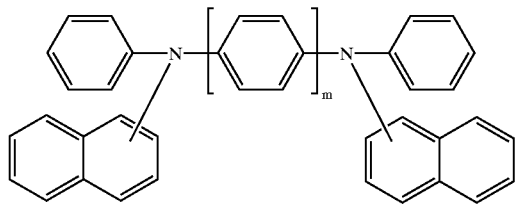

(in the formula, the reference character m is an integer of 1 or higher.

14. The organic electroluminescent device as claimed in claim 13, wherein the reference character m is an integer not lower than 1 and not higher than 12 in the general formula (VIII).

15. The organic electroluminescent device as claimed in claim 10, wherein said aromatic amine is a compound having the following general formula (IX):

(IX)

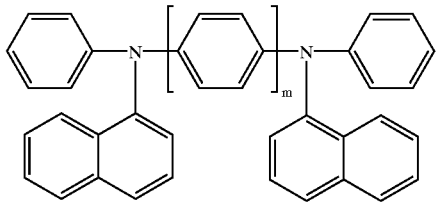

(in the formula, the reference character m is an integer of 1 or higher).

16. The organic electroluminescent device as claimed in claim 15, wherein the reference character m is an integer not lower than 1 and not higher than 12 in the general formula (IX).

17. The organic electroluminescent device as claimed in claim 10, wherein the metal M in the general formula (VI) is sodium, potassium, rubidium, or cesium.

18. The organic electroluminescent device as claimed in claim 10, wherein the metal M in the general formula (VI) is potassium.

* * * * *

UNITED STATES PATENT AND TRADEMARK OFFICE
CERTIFICATE OF CORRECTION

PATENT NO. : 6,703,147 B2
DATED : March 9, 2004
INVENTOR(S) : Fujii

It is certified that error appears in the above-identified patent and that said Letters Patent is hereby corrected as shown below:

Column 2,
Line 52, before "organic", delete "en";
Line 56, after "luminescent" replace "substance" by -- substance: --
Line 67, after "higher", insert -- , --.

Column 5,
Line 64, after "character", replace "14" by -- M --.

Column 7,
Line 58, before "twentieth", replace "Seventeenth," by -- seventeenth, --.

Column 14,
Line 38, before "device", delete "2".

Column 16,
Line 19, after "was", replace "$C_{30}H_2O$" by -- $C_{30}H_{20}$ --.

Column 17,
Line 67, before "luminance", replace "104 cd/m" by -- 104 cd/m$^2$ --.

Column 19,
Line 48, after "An", replace "Organic" by -- organic --.

Column 22,
Line 2, after "or", replace "higher." by -- higher). --.

Signed and Sealed this

Eighteenth Day of May, 2004

JON W. DUDAS
*Acting Director of the United States Patent and Trademark Office*